United States Patent
Sadeghian Marnani

(10) Patent No.: US 11,221,214 B2
(45) Date of Patent: Jan. 11, 2022

(54) DISTANCE SENSOR, ALIGNMENT SYSTEM AND METHOD

(71) Applicant: Nederlandse Organisatie voor toegepast-natuurwetenschappelijk onderzoek TNO, 's-Gravenhage (NL)

(72) Inventor: Hamed Sadeghian Marnani, The Hague (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 331 days.

(21) Appl. No.: 16/327,737

(22) PCT Filed: Aug. 25, 2017

(86) PCT No.: PCT/NL2017/050556
§ 371 (c)(1),
(2) Date: Feb. 22, 2019

(87) PCT Pub. No.: WO2018/038612
PCT Pub. Date: Mar. 1, 2018

(65) Prior Publication Data
US 2019/0178641 A1  Jun. 13, 2019

(30) Foreign Application Priority Data
Aug. 26, 2016 (EP) ................................. 16185923

(51) Int. Cl.
*G01B 21/16* (2006.01)
*G03F 9/00* (2006.01)
(Continued)

(52) U.S. Cl.
CPC .............. *G01B 21/16* (2013.01); *G01B 5/14* (2013.01); *G01B 5/16* (2013.01); *G01B 7/14* (2013.01);
(Continued)

(58) Field of Classification Search
CPC ........... G01B 21/16; G01B 5/14; G01B 5/16; G01B 7/14; G03F 9/7034; G03F 9/7053; B81B 3/00
See application file for complete search history.

(56) References Cited

U.S. PATENT DOCUMENTS

| 7,391,676 | B2* | 6/2008 | Bruinsma | ........... G01S 7/52004 367/99 |
| 2006/0138347 | A1* | 6/2006 | Bruinsma | ............. G03F 9/7034 250/491.1 |
| 2007/0089496 | A1* | 4/2007 | Degertekin | ............ G01Q 20/04 73/104 |

FOREIGN PATENT DOCUMENTS

| EP | 1674939 A1 | 6/2006 |
| WO | WO 2012/079634 A1 | 6/2012 |

OTHER PUBLICATIONS

Smith et al., "Design, Optimisation and Predicted Performance of a Micro-Machined IR Sensor that Exploits the Squeeze Film Damping Effect to Measure Cantilever Beam Displacement," Optics and Lasers in Engineering, vol. 45, No. 4, pp. 503-522, XP005863643 (Jan. 26, 2007).

(Continued)

Primary Examiner — Deoram Persaud
(74) Attorney, Agent, or Firm — Leydig, Voit & Mayer, Ltd.

(57) ABSTRACT

A distance sensor (1) for estimating a distance to a surface (OS) of an object (O), the distance sensor including a micro electric mechanical system (MEMS) (5), a detection means (30) and a processing device (40). The MEMS comprises a MEMS device (10) having a surface (12), denoted as MEMS sensor surface, to be arranged opposite the surface (OS) of said object (O) and a MEMS driver (20) for generating an ac driving signal to cause the MEMS sensor surface (12) to vibrate. The detection means (30) is to determine a value of (Continued)

a property of a dynamic behavior of the MEMS (5) and the processing device (40) is to estimate an average distance (h) as a measured distance (D2) between the MEMS sensor surface (12) and the surface (Os) of the object (O) based on the determined value for said property.

21 Claims, 8 Drawing Sheets

(51) Int. Cl.
    *G01B 5/14*     (2006.01)
    *G01B 5/16*     (2006.01)
    *G01B 7/14*     (2006.01)

(52) U.S. Cl.
    CPC .......... *G03F 9/7034* (2013.01); *G03F 9/7053* (2013.01)

(56) References Cited

OTHER PUBLICATIONS

European Patent Office, International Search Report in corresponding International Application No. PCT/NL2017/050556, dated Nov. 17, 2017 (3 pages).

\* cited by examiner

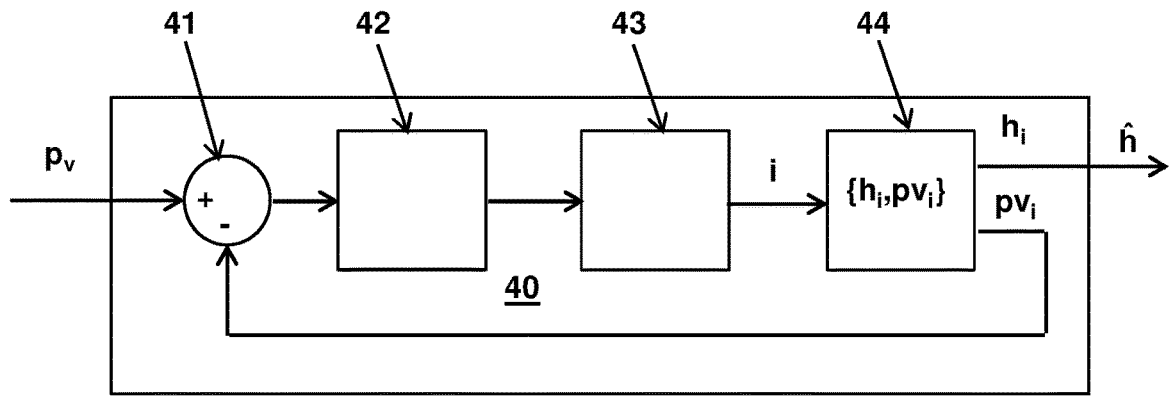
FIG. 3A
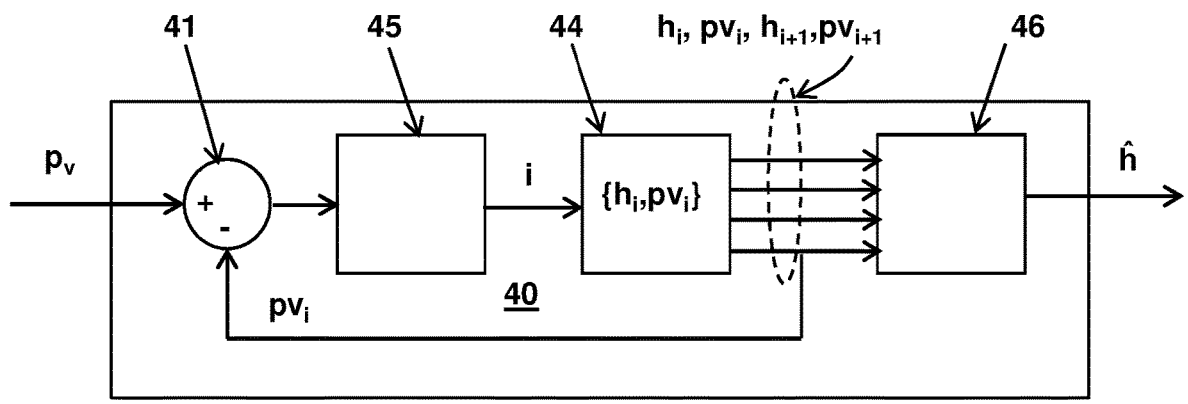
FIG. 3B
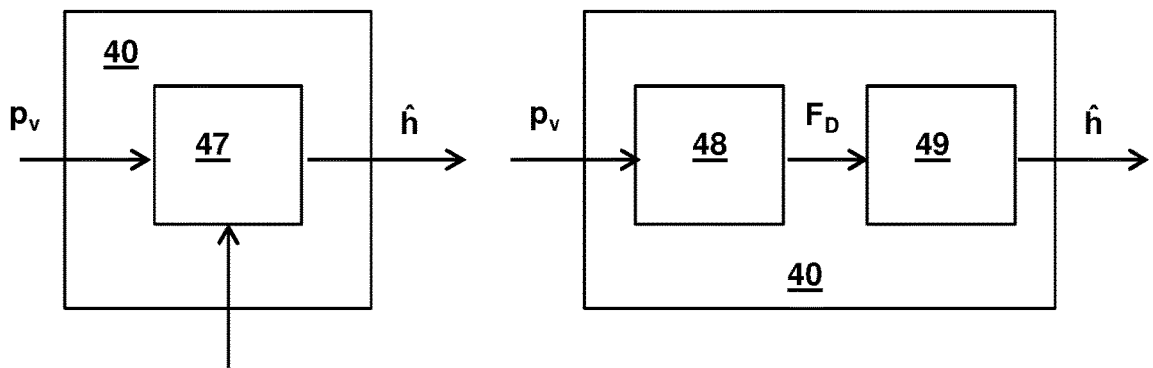
FIG. 3C
FIG. 3D

DISTANCE SENSOR, ALIGNMENT SYSTEM AND METHOD

CROSS-REFERENCE TO RELATED APPLICATIONS

This patent application is a U.S. National Phase of PCT International Application No. PCT/NL2017/050556, filed Aug. 25, 2017, which claims priority to European Application No. 16185923.6, filed Aug. 26, 2016, which are both expressly incorporated by reference in their entireties, including any references contained therein.

TECHNICAL FIELD AND BACKGROUND

The present disclosure relates to a distance sensor for estimating a distance between a first object and a second object.

The present disclosure further relates to an alignment system and method for positioning and/or keeping a first object at a controlled distance with respect to a second object.

In nano-manufacturing and metrology, it is often desired to have an optical element accurately positioned with respect to a substrate, e.g. wafer. Typically, a measurement is done initially with a level sensor, which maps the height of a target substrate, followed by the optical element being positioned based on the level sensing measurement. For example, in a lithographic apparatus an imaging lens can be used to project an image onto a wafer. To maintain focus, it is desired to keep a controlled distance between the imaging lens and the wafer. However, at high resolutions, even minute variations in the thickness, tilting, or waviness of the wafer can have a significant influence on the focus, e.g. while moving the wafer under the lens. Accordingly, it is desired to constantly monitor and align the distance at high precision.

For example, the distance can be measured using optical means such as interferometry. However, optical techniques are typically substrate dependent, e.g. affected by the reflection behavior of the substrate material. Alternatively, capacitive sensors can be used, but they are also substrate dependent, e.g. affected by the conductivity of the substrate. Alternatively, U.S. Pat. No. 7,021,120 discloses a high resolution gas gauge proximity sensor which may be less dependent on the substrate. However, this sensor comprises a complicated gas system and may affect vacuum conditions. Also the resolution may still be insufficient and the sensor relatively slow.

Accordingly, it is desired to provide a substrate independent alignment system to maintain distance between objects at high precision.

SUMMARY

The present disclosure provides a distance sensor for estimating a distance to a surface of an object. The distance sensor includes a micro electric mechanical system (MEMS) that comprises a MEMS device having a surface (further denoted as MEMS sensor surface) to be arranged opposite the surface of the object and a MEMS driver for generating an ac driving signal to cause the MEMS sensor surface to vibrate. The distance sensor further includes a detection means to determine a value of a property of a dynamic behavior of the MEMS. The distance sensor further includes a processing device to estimate an average distance from a measurement of the dampening of the MEMS sensor surface, as a measured distance between the MEMS sensor surface and the surface of the object based on the determined value for the property.

The mechanical behavior of the MEMS device depends on the distance between its surface and the surface of the object. The closer the MEMS sensor surface is to the surface of the object, the stronger the MEMS sensor surface is dampened by the medium between the MEMS sensor surface and the surface of the object. Accordingly, the average distance between the surfaces can be estimated from a measurement of the dampening of the MEMS sensor surface. In this way a rapid and accurate measurement of the distance is obtained without requiring a complicated gas system. The medium present between the MEMS sensor surface and the surface of the object may be air, as present in the environment or artificially supplied. Also other media such as inert gases, e.g. nitrogen or noble gases, or other gases, such as hydrogen are suitable. The pressure of the medium may be atmospheric pressure, or otherwise. For example for EUV applications hydrogen gas at a pressure of about 1 mbar may be used. The dampening of the MEMS device can be determined in various ways.

In an embodiment the property is a frequency with which the MEMS sensor surface vibrates. The MEMS device may for example be an active component in a resonance circuit, in that a mechanical dampening of the MEMS device has the effect of a reduction of the frequency of the resonance circuit. Accordingly, a lower resonance frequency, indicates a smaller distance.

In another embodiment the property is an amplitude with which the MEMS sensor surface vibrates. If the MEMS device is driven with a fixed amplitude drive signal, a mechanical dampening of the MEMS device has the effect of a reduction of the amplitude with which the MEMS device vibrates. Accordingly, a lower amplitude indicates a smaller distance. Alternatively, a feedback loop may be provided that keeps the vibration amplitude constant and measures the required amplitude of the supply signal. A larger amplitude of the drive signal indicates a smaller distance. According to again another alternative, the MEMS device is driven pulsewise and a time is measured wherein the amplitude of the resonance decays to a predetermined fraction, e.g. 0.5, of its value directly after a pulse. A shorter decay time indicates a shorter distance.

In again another embodiment, the property is a quality factor of the MEMS device. The shorter the distance the higher the dampening. Accordingly a lower quality factor indicates a shorter distance.

In a still further embodiment the property is a phase shift between a movement of the MEMS sensor surface and the ac driving signal. If the dampening increases the phase shift also increases. Accordingly, a larger phase shift indicates a shorter distance.

It is noted that the measurement does not have to be limited to one of these approaches. Instead a combination of approaches may be used. Also a particular measurement may be repeated with different parameters, for example with a different frequency or amplitude of the drive signal.

In embodiments the property of the dynamic behavior of the MEMS may be determined from electric parameters of the MEMS driver. For example in case the MEMS device itself determines the resonance frequency of the MEMS, i.e. the system formed by the combination of MEMS device and MEMS driver. In case a sensor is used to measure a property of the MEMS device, that sensor may be selected for example from a capacitive sensor, a thermal sensor, an optical sensor, and a piezo-resistive sensor.

Various options are available to estimate the distance from the observed property. According to one option the property of the dynamic behavior of the MEMS is determined for a series of distances and the values observed for the respective distances are stored in a lookup table. In an operational mode of the distance sensor the lookup table is used to estimate the distance as the measured distance. For example the estimated distance is the distance found in the lookup table that corresponds to the value of the property that best matches the value of the property observed in the operational mode. Alternatively the value for the distance may be determined by interpolation. For example a linear interpolation of the distances found in the lookup table that correspond to a pair of values of the property in the table that best match the value of the property observed in the operational mode, wherein the pair of values include the highest value in the lookup table that is lower than the observed value and the lowest value in the lookup table that is higher than the observed value. According to another option, the property of the dynamic behavior of the MEMS is determined for a series of distances and the values observed for the respective distances are used to estimate a relation between the distance and the property. For example the set of observations is used to estimate a polynomial relationship between the distance and the value of the property. Then in an operational mode the estimated polynomial relationship is used to estimate the distance from the observed value of the property.

According to another option the relation between the observed value and the distance is determined using an analytical solution of the differential equation defining the dampening effect. The dampening effect is determined by Reynolds equation:

$$\frac{h^3}{12\eta}\left(\frac{\partial^2 p}{\partial x^2} + \frac{\partial^2 p}{\partial y^2}\right) = \frac{h}{P_a}\frac{\partial p}{\partial t} + \frac{\partial h}{\partial t},$$

Therein h[m] is the average distance between the surfaces, $\eta[kg \cdot m^{-1} \cdot s^{-1}]$ is the dynamic viscosity of the medium between the surfaces, x,y [m] are lateral coordinates, i.e. in a plane parallel to the opposed surfaces and t [s] the time. Furthermore Pa, $p[kg \cdot m^{-2} \cdot s^{-1}]$ respectively are the ambient pressure of the medium and the film pressure exerted as a function of the lateral coordinates x, y on the MEMS sensor surface. An analytical solution is provided for example by Steeneken et al. in "Dynamics and squeeze film gas damping of a capacitive RF MEMS switch", DOI 10.1.1.660.4439. According to the analytical solution presented therein the squeeze film damping force $F_D[kg \cdot m \cdot s^{-2}]$ is:

$$F_D = -b\frac{v}{z^3},$$

wherein

The parameter $b[kg \cdot m^3 \cdot s^{-1}]$ is defined as the squeeze film damping constant, $v[m \cdot s^{-1}]$ is the velocity of the MEMS sensor surface and z[m] is the average distance of the MEMS sensor surface to the surface it opposes. Accordingly, the magnitude of the damping force $F_D$ is a monotonically decreasing function of the average distance z. Hence the damping force $F_D$, unambiguously indicates the value of z. Similarly any parameter that is a monotonic function of this damping force, such as phase shift, frequency shift, or the like also unambiguously indicates the value of z. Typically the amplitude with which the MEMS sensor surface vibrates is substantially smaller than the average distance. For example the average distance is in the order of a few tens of micrometers and larger, e.g. in the range of 20 to 200 micrometer, whereas the amplitude is in the order of a few hundreds of nanometers to a micrometer.

The present disclosure further provides an alignment system for positioning and/or keeping a first object at a controlled distance with respect to a second object. The alignment system, further also denoted as alignment system, comprises an object stage configured to hold the first object or the second object, wherein a surface of the first object at a distance over a surface of the second object. The alignment system comprises an object stage actuator configured to actuate the object stage to vary the distance between the surfaces of the first and second objects. The object stage is thus configured to move the first and/or second objects relative to each other to change the distance there between. The alignment system further comprises a distance sensor as specified above. The first object is, in use, held by the object stage. The alignment system comprises a controller configured to control the object stage actuator as a function of the distance as estimated by the distance sensor to keep the first object at the controlled distance with respect to a second object. The distance between the distance sensor and the second object may differ from the distance between the first and the second object.

By using a feedback loop the distance can be accurately maintained when the height of the second object varies. For example, the distance can be controlled on the basis of a feedback signal from the distance sensor. By connecting the distance sensor at a variable distance from the object stage via a sensor stage, the probe level distance (e.g. measured transverse to the surface of the second object) can be varied. For example, a sensor stage comprising an actuator can be configured to variably set the sensor level distance between a level of the MEMS sensor surface and a level of the surface of the first object. Typically, the sensor stage is configured to translate the distance sensor in the same direction as the object stage actuator. For example, the sensor stage is configured to translate the distance sensor with respect to the first object. Accordingly, the sensor level distance can be set to provide any desired distance between the first object and second object. The sensor stage can be a high precision stage, e.g. micrometer or even nanometer resolution. The sensor stage may e.g. comprise a combination of a micrometer resolution motorized stage and a nanometer resolution piezo stage. Accordingly, the sensor level distance between the first object and the MEMS sensor surface can be set close or equal to the desired distance between the first object and second object, e.g. within a margin of less than one micrometre, less than hundred nanometres, or less than ten nanometres, e.g. between one and ten nanometer. This may depend e.g. on a proximity at which the MEMS sensor surface is intended to operate relative to the surface of the second object. Preferably, the controller is configured to calibrate the sensor level distance between the probe tip and the first object.

By providing multiple distance sensors, each can measure a distance between a respective MEMS sensor surface and different parts of the surface of the second object. One or more object stage actuators can be configured to control respective distances between the first object and the different parts of the surface of the second object. Accordingly, the one or more object stage actuators may control a distance and/or tilt of the first object with respect to the surface of the second object. For example, an overall slow alignment and approach stage can be provided to move the alignment system towards a substrate. For example the object stage actuators can be disposed between the approach stage and the object stage. The object stage actuators can provide relative fast adjustment of the distance and or tilt of the first object. The object stage can be configured to hold the first object at any position with respect to the MEMS sensor surface. By holding the first object adjacent the MEMS sensor surface over the surface of the second object, the distance between the objects can be very small. For example, the distance between the first object and the second object is less than hundred nanometres, less than fifty nanometres, e.g. between five and twenty nanometres. By keeping a small lateral distance between the MEMS sensor surface and the edge of the adjacent first object (measured e.g. across the surface of the second object), the height of the second object measured by the MEMS sensor surface is typically representative of the height at the first object. Accordingly, it is preferable that a lateral distance between the MEMS sensor surface and an edge of the first object along a surface of the second object is less than five centimetres, two centimetres, one centimetre, or even less.

Feed forward control may be employed as a further improvement in an arrangement wherein a first object (e.g. a lens) is scanned in a scanning direction over a second object (e.g. a wafer) and wherein a MEMS sensor is arranged in front, i.e. ahead in the scanning direction, of the first object. Therein a depth measurement result obtained from the MEMS sensor in an instantaneous position in the scanning direction is used by the feed forward control to correct a position of the first object so that its height is adapted in accordance with said depth measurement result when it reaches the instantaneous position. Therewith positioning errors due to a height gradient in the scanning direction are prevented also if the MEMS sensor and the first object are spaced apart. As an additional advantage a slower control system suffices to position the first object as it has time to anticipate for the height variations of the surface of the second object. For example the distance sensor comprises a high frequency actuator, e.g. piezo, configured to vibrate the MEMS sensor surface. By reflecting a light beam at a surface of the MEMS opposite the MEMS sensor surface, the direction of the reflected light beam may be used to determine the dynamic behavior of the MEMS. For example, by using an optical fibre, light can be directed between the opposite surface and an interrogator. For example an interrogator, e.g. based on interferometric principles can be used. The interrogator may provide a feedback signal to the controller indicative of a proximity between distance sensor and the surface of the second object. Also other means, such as capacitive, thermal, piezo-resistive means, may be used to determine the dynamic behavior of the MEMS.

Preferably at least three distance sensors are used to measure not only distance but also the tilt of the surface in two directions. Also more, e.g. four distance sensors can be used, e.g. for noise reduction. Also other types of distance sensors may be used in combination with the MEMS based distance sensors as specified above. By providing the distance sensors in a triangular configuration, the distance sensors can be arranged around a circumference of the first object as seen transverse to the surface of the second object. The tilt of the first object with respect to the surface of the second object can be based on the measurements of the three distance sensors. The alignment system may e.g. use three non-coupled controllers or an integrated controller. Accordingly three or more distance sensors can be synchronized to cooperate in maintaining a desired alignment between the objects.

It will be appreciated that the present alignment systems and methods can be employed e.g. in nanomanufacturing, e.g. in a lithographic apparatus comprising the alignment system. For example, the first object is a lens and the second object a mask. Accordingly, the object stage can be configured to hold the lens at a specific controlled distance from the mask. Typically, the lithographic apparatus comprises a mask stage and the lens is part of an imaging system configured to project an image onto the wafer. An (actinic) light source can be used project a mask image via the lens onto the substrate. Advantageously, the alignment system can be configured to calibrate the sensor level distance between the MEMS sensor surface and the lens based on an image projected through the lens onto the second object, e.g. by a contrast measurement of the projected image. The present alignment systems and methods can also be used in nano-metrology, nano-imaging, and/or inspection, to keep a nano-lens in focus or at a certain distance to the surface, such as solid immersion lens, hyper lens, metasurface, nanoantenna, super oscillatory lens and any other type of nearfield lens.

The substrate can be held by a wafer stage, wherein the wafer stage is configured to move the wafer along a surface direction i.e. transverse to the distance between the lens and the wafer. The alignment system provides the particular advantage of keeping the first object at the controlled distance from the second object while moving the first object over the surface of the second object. More particularly the lithographic apparatus can be configured to keep the lens at a controlled distance from the wafer while moving the lens over the surface of the wafer. For example, the distance between the lens and wafer can be very small, e.g. in the range of one to hundred nanometer.

Another or further aspect of the present disclosure provides a method of aligning a first object at a controlled distance with respect to a second object. The method comprises providing an object stage to hold a surface of the first object at a distance over a surface of the second object; providing an object stage actuator to actuate the object stage to vary the distance between the surfaces of the first and second objects; providing a distance sensor for measuring a distance to a surface of an object, the distance sensor including a micro electric mechanical system comprising a MEMS device having a surface to be arranged opposite the surface of said second object and a MEMS driver for generating an ac driving signal to cause the MEMS sensor surface to vibrate, a detection means to determine a value of a property of a dynamic behavior of the MEMS and a processing device to estimate an average distance from a measurement of the dampening of the MEMS sensor surface, as a measured distance between the MEMS sensor surface and the surface of the second object based on the determined value for said property; controlling the object stage actuator as a function of the measured distance to keep the first object at the controlled distance with respect to a second object.

BRIEF DESCRIPTION OF DRAWINGS

These and other features, aspects, and advantages of the apparatus, systems and methods of the present disclosure will become better understood from the following description, appended claims, and accompanying drawing wherein:

FIG. 3A shows a part of an embodiment of a distance sensor in more detail;

FIG. 3B shows an alternative for said part;

FIG. 3C shows a further alternative for said part;

FIG. 3D shows a still further alternative for said part;

DESCRIPTION OF EMBODIMENTS

Figure 1:
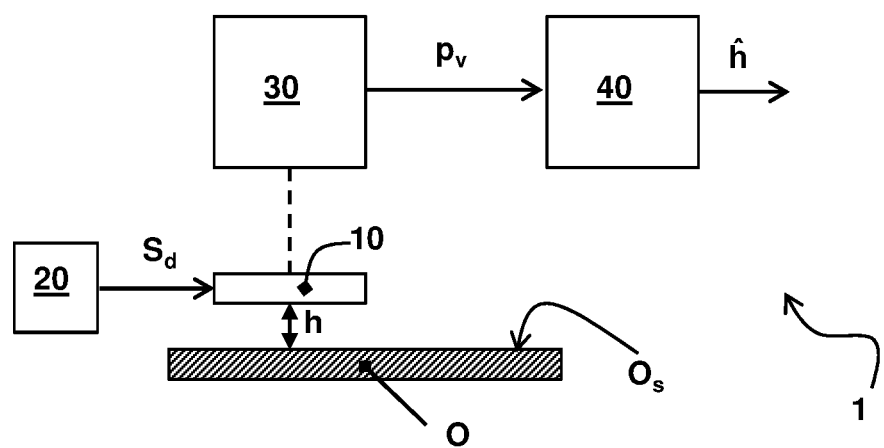
FIG. 1 schematically shows a first embodiment of a distance sensor.

FIG. 1 schematically shows a distance sensor 1 for estimating a distance to a surface $O_S$ of an object O. The distance sensor includes a microelectromechanical system, also denoted as MEMS. The MEMS comprises a MEMS device 10 having a surface 12 to be arranged opposite the surface $O_S$ of the object O. The MEMS device 10 is coupled to a MEMS driver 20 for generating an ac driving signal $S_d$ to cause the MEMS sensor surface 12 to vibrate. The drive signal Sd may for example have a predetermined frequency in the range of 1 kHz to 100 kHz, for example between 5 and 50 kHz. The predetermined frequency may be selected in accordance with an expected distance between the MEMS sensor surface and the object surface. Alternatively, the drive frequency may be swept between a minimum value and a maximum value. In another embodiment the drive frequency depends on the dampening experienced by the MEMS device 10. A detection means 30 is provided to determine a value $p_v$ of a property of a dynamic behavior of the MEMS and a processing device 40 is provided to estimate an average distance h between the MEMS sensor surface 12 and the surface $O_S$ of the object O based on the determined value $p_v$ for said property and to indicate this estimation with an output signal ĥ.

Figure 1A:
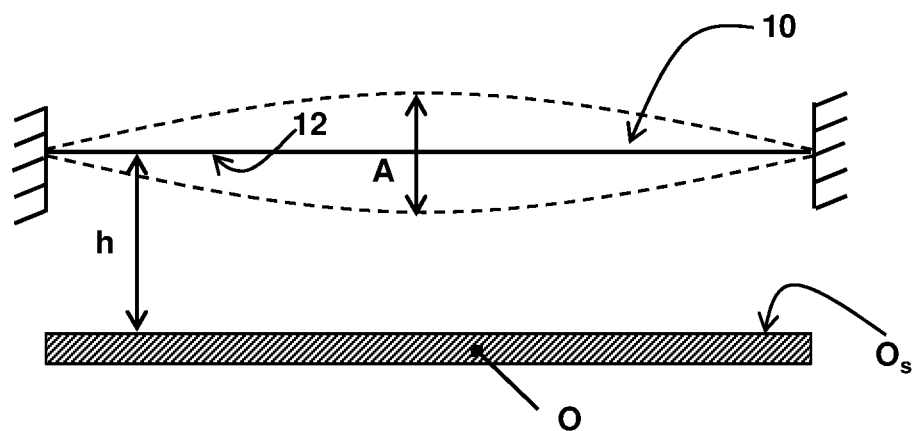
FIG. 1A shows a part of an embodiment of a distance sensor in more detail.

FIG. 1A schematically shows the MEMS device as a membrane having a membrane surface 12 that vibrates with an amplitude A. The membrane may have lateral dimensions in the order of a few micrometers to few hundred of micrometers. The membrane may for example have a circular membrane surface with a diameter in said range as the lateral dimension or a square membrane having an edge in said range as the lateral dimension. Also membranes having a form other than circular or square may be employed, e.g. rectangular or oval. More specifically, the membrane may have a lateral dimension in the range of 1-1000 micrometer, for example in the range of 20-500 micrometer, for example in the range of 50-200 micrometer.

For illustration purposes the magnitude of the vibration is somewhat exaggerated. In practice the order of magnitude of the amplitude A will be substantially less than that of the average distance h.

In the embodiment shown in FIG. 1 the detection means determines the value $p_v$ of the property of the dynamic behavior of the MEMS in a contactless manner. The detection means for example uses interferometry to determine an amplitude A of the MEMS device 10, e.g. the amplitude A of the membrane as the property. The amplitude A is a monotonically decreasing function of the squeeze film damping exerted on the membrane, and therewith is indicative of the average distance h. Similarly, the detection means may determine a phase shift occurring between the movement of the MEMS device 10 and the signal with which the MEMS device is driven. The phase shift is a monotonically increasing function of the squeeze film damping exerted on the membrane, and therewith also is indicative of the average distance h.

Alternatively or in addition other properties may be determined, such as a quality factor of the MEMS device 10. The quality factor is a monotonically decreasing function of the squeeze film damping exerted on the membrane, and therewith is indicative of the average distance h.

It is noted that the detection means is not limited to an optical sensor, such as an interferometric sensor. Also other types of sensors may be used instead or in addition, for example one or more of a capacitive sensor, a thermal sensor, an optical sensor, or a piezoresistive sensor.

Figure 2:
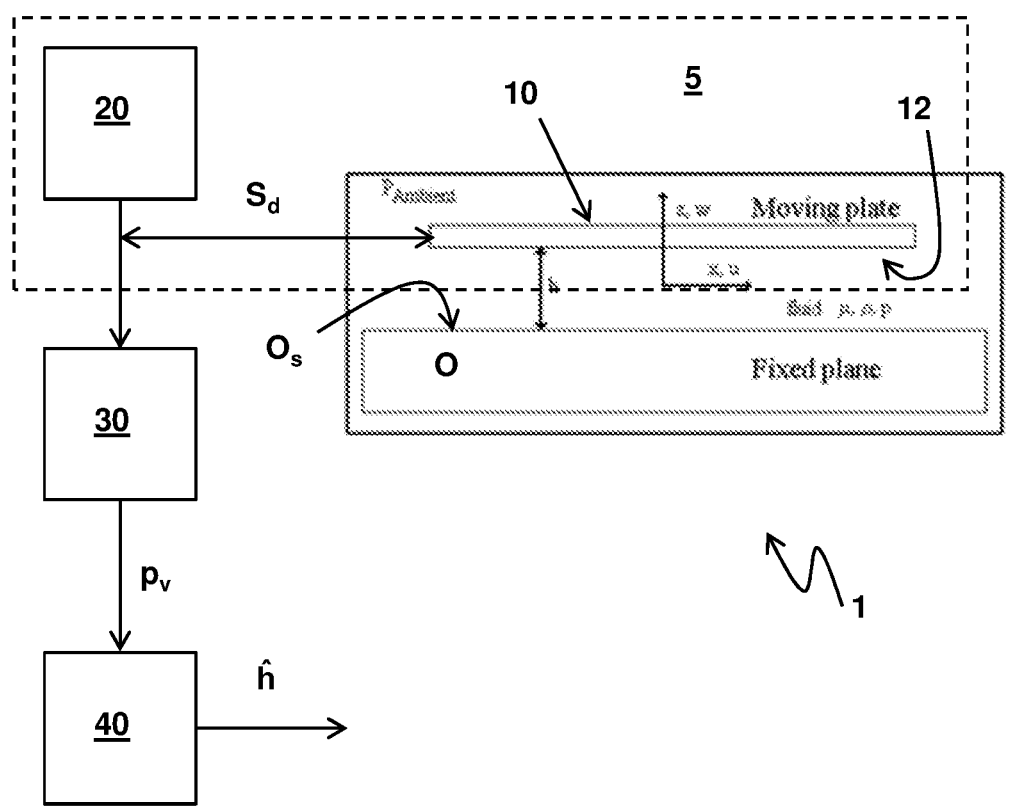
FIG. 2 schematically shows a second embodiment of a distance sensor.

FIG. 2 shows an alternative embodiment, wherein the observed property is not a property of the MEMS device 10, such as its amplitude or quality factor, but instead is a property of the MEMS 5, including the MEMS driver 20 and the MEMS device 10. In this embodiment a change in the drive signal Sd or in a signal related thereto is measured that depends on the magnitude of squeeze film damping exerted on the MEMS device. Upon decreasing the average distance h of the MEMS sensor surface 12 to the surface $O_S$ of the object O, an increased squeeze film damping occurs. As a result the mechanical load of the MEMS device 10 and therewith the electrical load, i.e. the power consumption, for the MEMS driver 20 increases. Accordingly the power consumption is indicative for the average distance between the surfaces 12, $O_S$.

FIG. 3A shows a first embodiment of the processing device 40. In this embodiment the processing device 40 includes a lookup table 44 that includes for each of a plurality of values $h_i$ a respective value $pv_i$ that was observed for the property indicative for the distance. The value pairs $h_i$, $p_{vi}$ were obtained in an initialization mode wherein the distances $h_i$ were varied and measured with a reference distance meter. The embodiment further includes a subtraction element 41 to determine the difference $pv-pv_i$, an absolute value determining element 42 to determine the absolute value of this difference, and an optimizer 43 to select the index i that minimizes this absolute value. Hence, in this embodiment the estimated value ĥ for the average height h is determined as:

$$\hat{h} = h_j, \text{ wherein } j = \min_i \text{Abs}(pv - pv_i)$$

FIG. 3B shows a second embodiment of the processing device 40. The processing device of FIG. 3B differs from the one in FIG. 3A in that elements 42 and 43 are replaced by optimizer 45. Optimizer 45 selects the index j that minimizes the difference $pv-pv_i$, with the condition that $pv_i < pv$. The processing device of FIG. 3B differs from the one in FIG. 3A in that the lookup table 44 not only outputs the value pair hi, pvi, but additionally outputs the subsequent value pair $h_{i+1}$, $p_{vi+1}$. The processing device of FIG. 3B further additionally includes an interpolator 46 that calculates the value $\hat{h}$ by interpolation using these two value pairs. Hence the estimated value $\hat{h}$ for the average height h is determined as:

$$\hat{h} = h_j + \left(\frac{pv - pv_j}{pv_{j+1} - pv_j}\right)(h_{j+1} - h_j), \text{ wherein}$$

$$j = \min_i(pv - pv_i), pv_i < pv$$

In other words the estimated value for h is interpolated from the next lower $h_j$ and the next higher value $h_{j+1}$ in the table having a corresponding value $pv_j$, $pv_{j+1}$ closest to the measured value pv.

FIG. 3C shows a still further embodiment of the processing device 40 wherein the average value for h is estimated using a polynomial function $h(v_p)$ incorporated in approximation module 47. The parameters of the polynomial function were obtained by curve fitting the polynomial function through a set of $h_i$, $p_{vi}$ value pairs obtained in an initialization mode of the device. Alternatively the approximation module 47 may be implemented as a neural network, that is arranged for this function in a preceding supervised training phase wherein it is provided with the set of $h_i$, $pv_i$ value pairs for this purpose.

FIG. 3D shows again a further embodiment of the processing device 40 having a processing module 49 wherein the average distance h is estimated from the observed damping forces $F_D$ as.

$$\hat{h} = \sqrt[1/3]{\frac{bv}{-F_D}}$$

Therein v is the average velocity of the membrane. I.e. for a membrane vibrating with amplitude A and frequency f, the average velocity equals $$v = \frac{2}{\pi}Af$$

The damping force $F_D$ on their turn are calculated in processing module 48 from the observed property pv, such as the amplitude of the MEMS device 10, is frequency, a phase delay with respect to the driving signal, an electrical load observed for the MEMS driver 20.

Figure 4A:
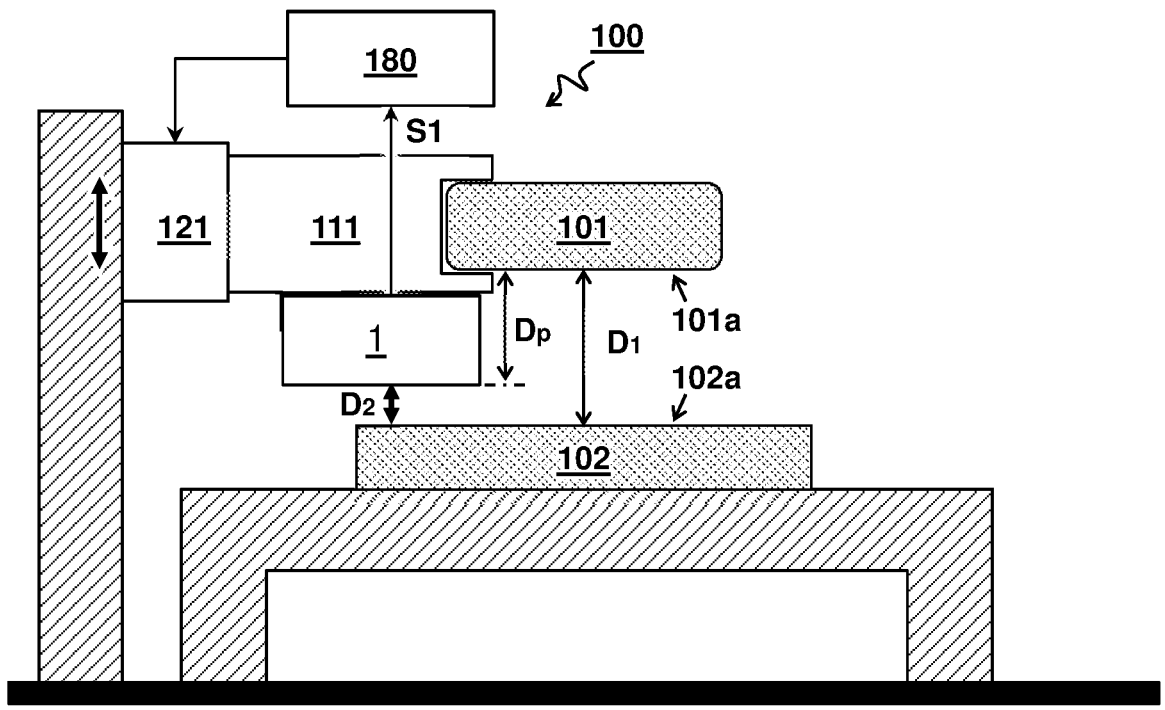
FIG. 4A schematically illustrates a first embodiment of an alignment system.

FIG. 4A schematically illustrates a first embodiment of an alignment system 100 for keeping a first object 101 at a controlled distance D1 with respect to a second object 102.

In the embodiment, the alignment system 100 comprises an object stage 111 configured to hold a surface 101a of the first object 101 at a distance D1 over a surface 102a of the second object 102. An object stage actuator 121 is configured to actuate the object stage 111 to vary the distance D1 between the surfaces 101a, 102a of the first and second objects 101, 102. A distance sensor 1 is provided for estimating a distance D2 to the surface 102a of the second object 102. More in particular, as illustrated in FIG. 1, the distance sensor includes a micro electric mechanical system (MEMS) which comprises a MEMS device having a surface arranged opposite the surface 102a of the second object 102 and a MEMS driver for generating an ac driving signal to cause the MEMS sensor surface to vibrate. As also schematically illustrated in FIG. 1, the distance sensor includes a detection means to determine a value of a property of a dynamic behavior of the MEMS and a processing device to estimate an average distance $D_2$ between the MEMS sensor surface and the surface 102a of the second object 102 based on the determined value for said property.

In one embodiment, a controller 180 is configured to control the object stage actuator 121 as a function of the estimated average distance $D_2$ to keep the first object 101 at the controlled distance $D_1$ with respect to the second object 102. For example, the controller 180 is configured to receive a feedback signal $S_1$ from the distance sensor 1 indicative for the estimated average distance $D_2$ and to control the object stage actuator 121 to keep the first object 101 at the controlled distance $D_1$ from the second object 102 based on the feedback signal $S_1$.

In embodiments elements of the distance sensor may be integrated into the controller. For example the controller 180 may include one or more of the MEMS driver 20, the detection means 30 and the processing device 40. A plurality of MEMS sensors can be used for example to reduce a noise level of the measurement as well as to increase the measurement speed.

According to some aspects, the figure illustrates a method of aligning a first object 101 at a controlled distance $D_1$ with respect to a second object 102. In one embodiment, the method comprises providing an object stage 101 to hold a surface 101a of the first object 101 at a distance $D_1$ over a surface 102a of the second object 102. In another or further embodiment, the method comprises providing an object stage actuator 121 to actuate the object stage 111 to vary the distance $D_1$ between the surfaces 101a, 102a of the first and second objects 101, 102. In another or further embodiment, the method comprises moving the second object 102 laterally with respect to the first object 101 while keeping the controlled distance $D_1$ constant.

While the present embodiment shows the first object 101 being moved, alternatively or in addition, the second object 101 can be moved. For example, in one embodiment (not shown), the alignment system 100 comprises an object stage configured to hold a surface 102a of the second object 102 at a distance $D_1$ below a surface 101a of the first object 101. Similar as the shown embodiment, an object stage actuator 121 is configured to actuate the object stage to vary the distance $D_1$ between the surfaces 101a, 102a of the first and second objects 101, 102 (however by moving the second object). Similar as the shown embodiment, a distance sensor 1 may be provided that is fixed to the second object and that measures a distance to a surface of the first object. Optionally, the first object 101 can be held stationary, e.g. by a rigid construction or platform that does not move in the direction towards the second object 2.

Figure 4B:
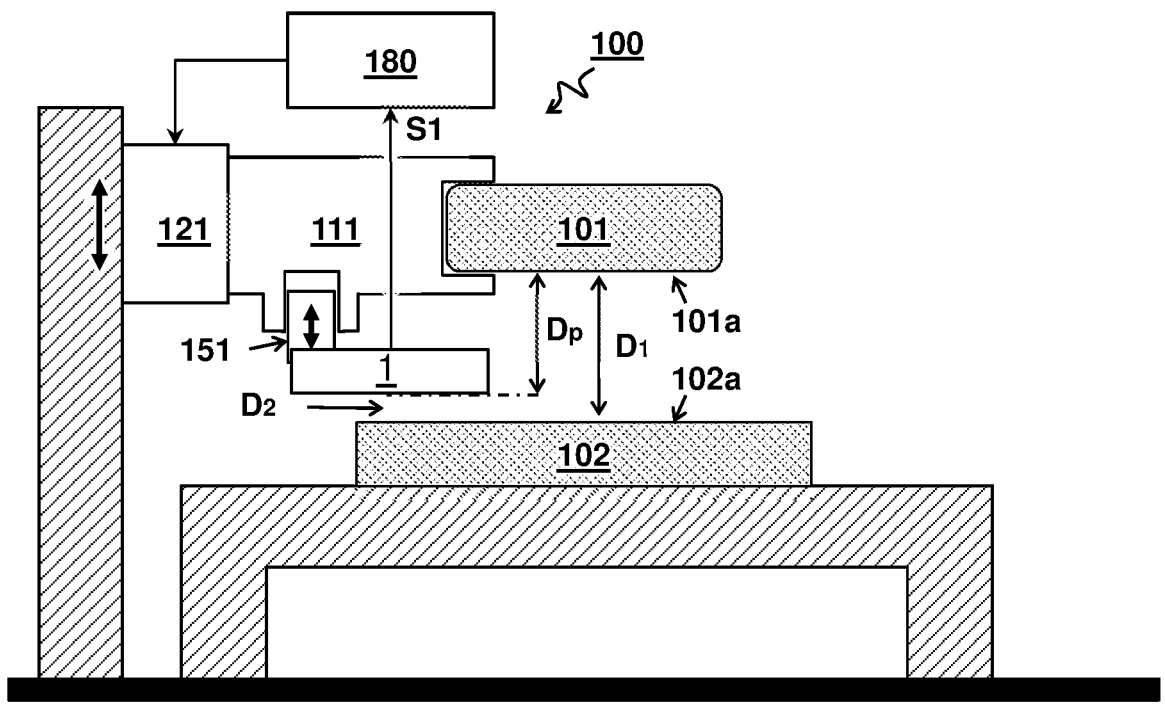
FIG. 4B schematically illustrates a second embodiment of an alignment system with adjustable sensor distance.

FIG. 4B schematically illustrates a second embodiment of an alignment system 100.

In the embodiment, the distance sensor 1 is connected to the object stage 111 via a sensor stage 151, wherein the sensor stage 151 comprises an actuator configured to variably set a distance Dp between a surface 101a of the first object and surface 12 (See FIG. 1) of the distance sensor 1. For example, the distance Dp is measured transverse to the surface 102a of the second object 102. In another or further embodiment, the probe level distance Dp is set as a function of a desired distance $D_1$ between the first object 101 and second object 102.

In one embodiment, the distance Dp between the surface 101a of the first object 101 and the MEMS sensor surface 12 is set close or equal to the desired distance D1 between the first object 101 and second object 102, e.g. within a margin of less than one micrometre, less than hundred nanometres, or less than ten nanometres. In one embodiment, the sensor stage 151 is configured to translate the distance sensor 1 in the same direction as the object stage actuator 121. For example, the sensor stage 151 is configured to translate the distance sensor 1 with respect to the first object 101.

Figure 5A:
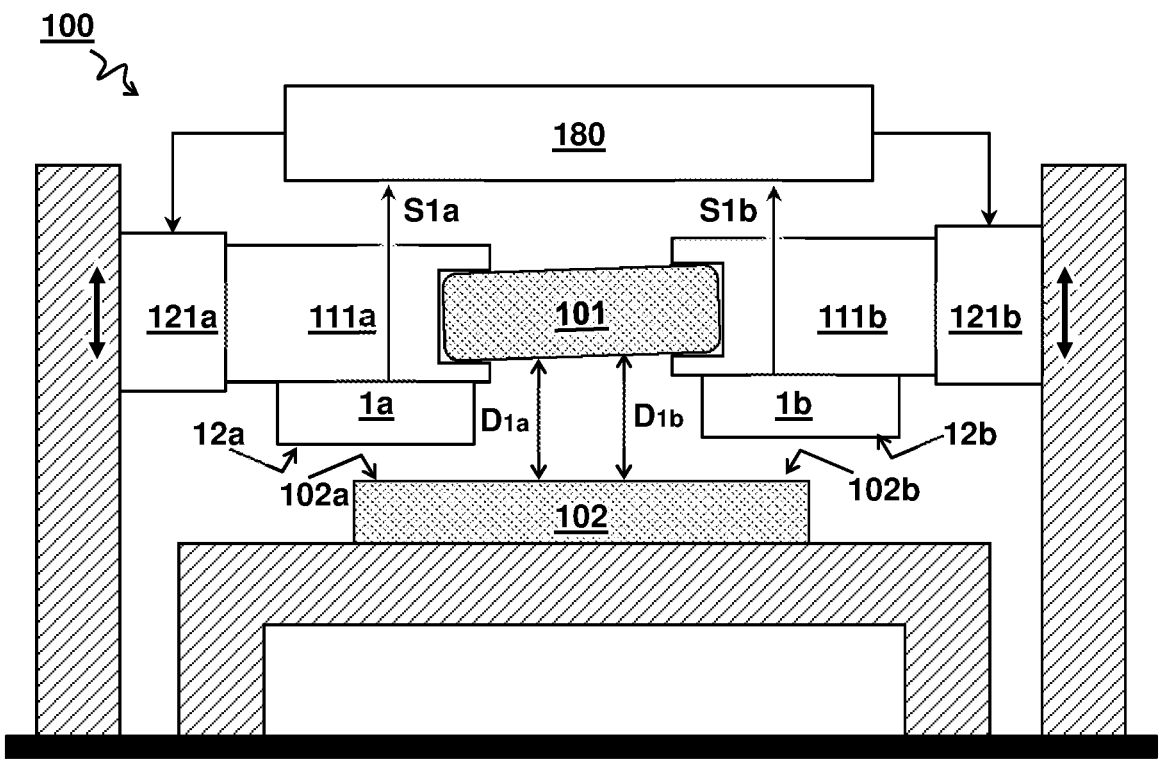
FIG. 5A schematically illustrates a third embodiment of an alignment system with multiple distance sensors.

FIG. 5A schematically illustrates a third embodiment of an alignment system 100 with multiple distance sensors.

In one embodiment, the alignment system 100 comprises at least two distance sensors 1a, 1b each configured to measure a distance between a respective MEMS sensor surface 12a,12a and different parts 102a,102b of the surface of the second object 102. The sensors 1a, 1b issue a respective signal S1a, S1b, indicative for the measured (estimated) distance. In another or further embodiment, the alignment system comprises one or more object stage actuators 121a,121b. These actuators 121a, 121b are provided to independently position the object stages 111a, 111b at respective positions $Z_3$, $Z_4$ relative to the approach stage 160, and therewith are configured to control respective distances D1a,D1b between the first object 101 and the different parts 102a,102b of the surface of the second object 102. In another or further embodiment, the one or more object stage actuators 121a,121b are configured to control a distance and tilt of the first object 101 with respect to the surface 102a,102b of the second object 102.

Figure 5B:
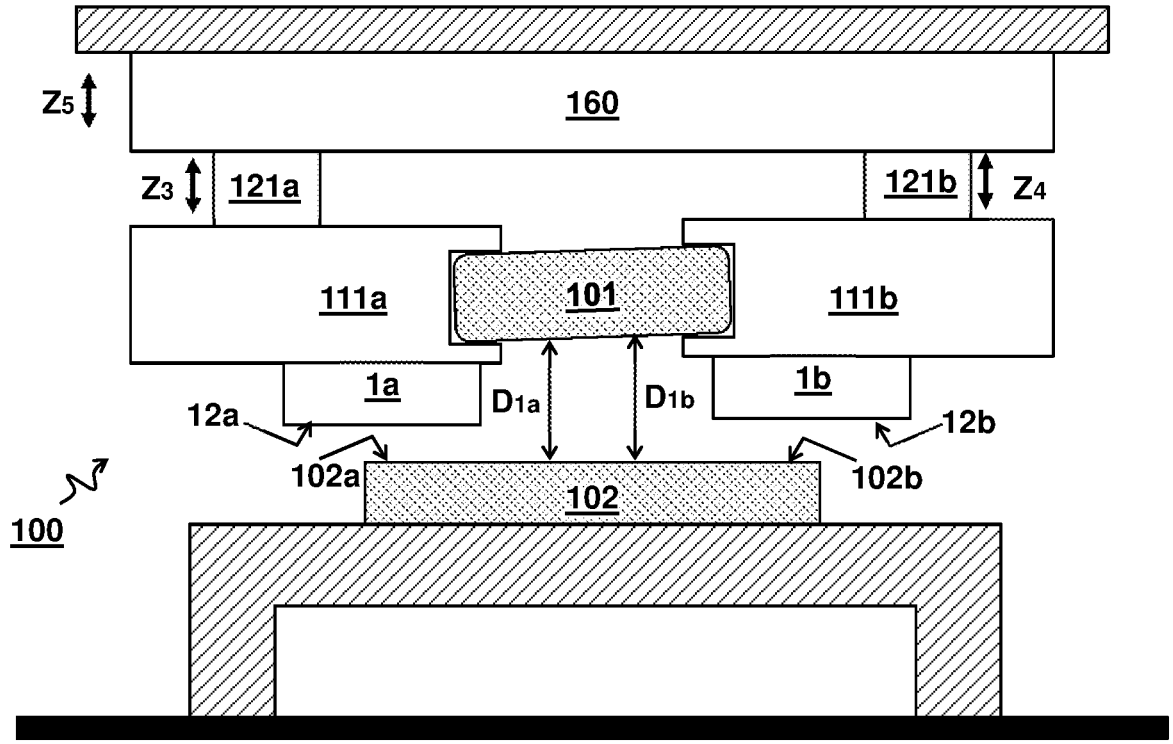
FIG. 5B schematically illustrates a fourth embodiment of an alignment system including an approach stage.

FIG. 5B schematically illustrates a fourth embodiment of an alignment system 100 comprising an approach stage 160 configured to position the first object 101 with respect to the second object 102. In one embodiment, a plurality of object stage actuators 121a,121b are disposed between the object stage 111a, 111b and the approach stage 160.

Figure 6:
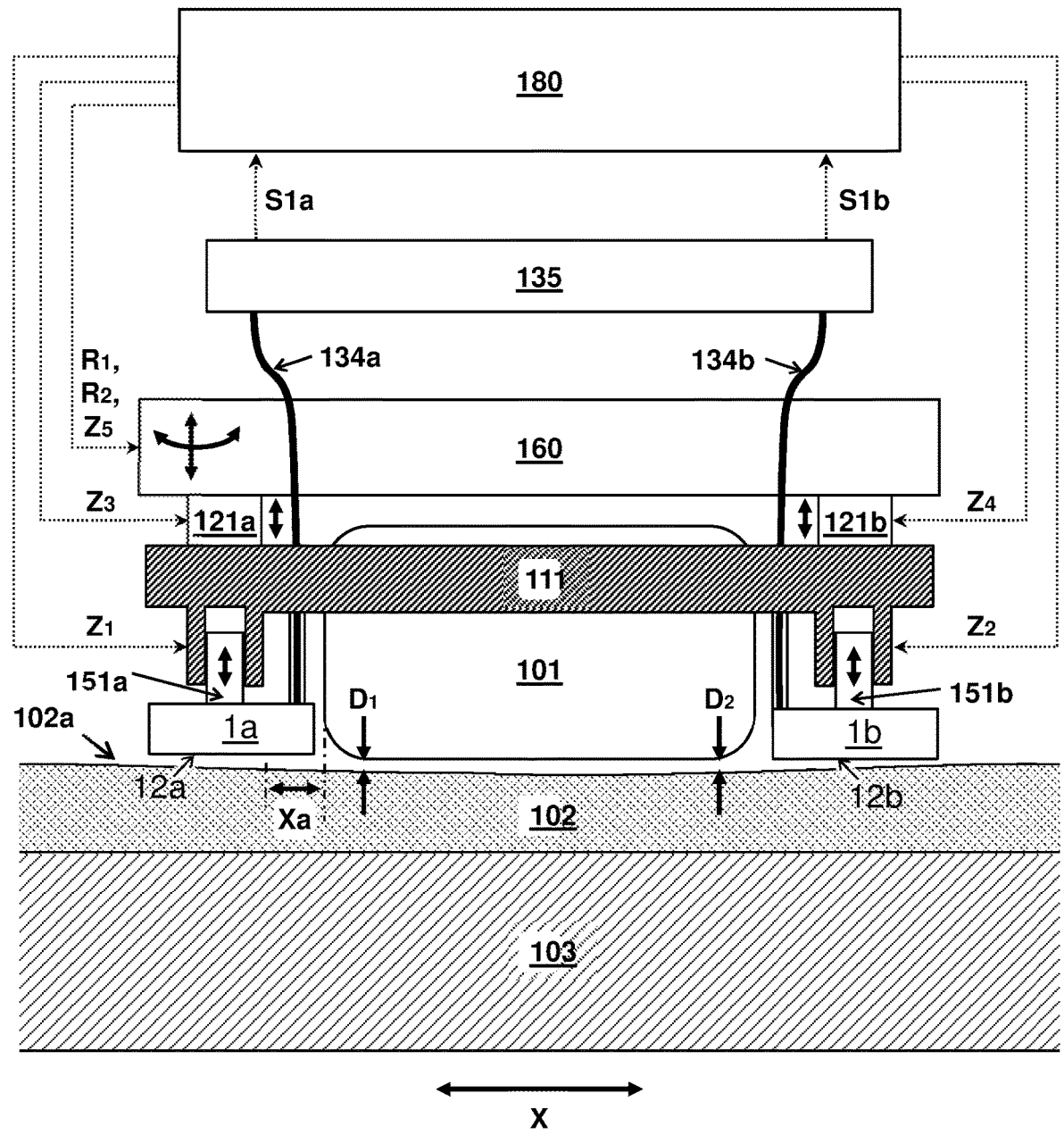
FIG. 6 schematically illustrates a fifth embodiment of an alignment system combining features of some of the other embodiments.

FIG. 6 schematically illustrates a fifth embodiment of an alignment system combining features of some of the other embodiments. In the embodiment, the alignment system 100 comprises multiple distance sensors 1a, 1b. In the embodiment, the alignment system 100 comprises multiple object stage actuators 121a,121b disposed between the object stage 111 and an approach stage 160.

In one embodiment, the object stage 111 is configured to hold the first object 101 adjacent the surface 102a of the second object 102. In another or further embodiment, the distance D1 between the first object 101 and the second object 102 is less than hundred nanometres, less than fifty nanometres, e.g. between five and twenty nanometres. In one embodiment, a lateral distance Xa between the MEMS sensor surface 12a and an edge of the first object 101 along a surface 102a of the second object 102 is less than five centimetres, two centimetres, one centimetre.

For example, the approach stage 160 comprises an overall slow alignment and approach stage having a resolution e.g. of 100 nm (distance Z5) and/or 10 μrad (tilt R1,R2). For example, the object stage actuators 121a,121b provide the object stage 111 with relatively fast tracking (distances $Z_3$, $Z_4$ respectively), e.g., having a range of 3 μm and high resolution of less than 1 nanometre. In one embodiment the sensor stage 151a, 151b comprises a coarse alignment which can be for example manually operated. For example the coarse alignment has a range of 500 μm and resolution of one micrometer. Alternatively, or additionally, for example the sensor stage 151a, 151b comprises medium alignment (distances $Z_1$, $Z_2$ respectively) with a lower range, e.g. 5 μm and a higher resolution, e.g. 1 nm. For example three or more distance sensors can be used as will be described with reference to FIG. 7.

In one embodiment of the alignment system the signal lines 134a, 134b are provided that extend between a driver/detector unit 135 and the distance sensors 1a, 1b. The signal lines 134a, 134b are configured to provide an ac driving signal to the distance sensors 1a, 1b and to transmit signals indicative for a determined value of a property of the dynamic behavior of the MEMS forming part of the distance sensors. In another or further embodiment, the driver/detector unit 135 is configured to send a feedback signal S1a, S1b to the controller 180 indicative of a proximity between the MEMS sensor surfaces 12a, 12b and the surface 102a of the second object 102. The controller 180 can e.g. comprise a feedback controller.

Figure 7A:
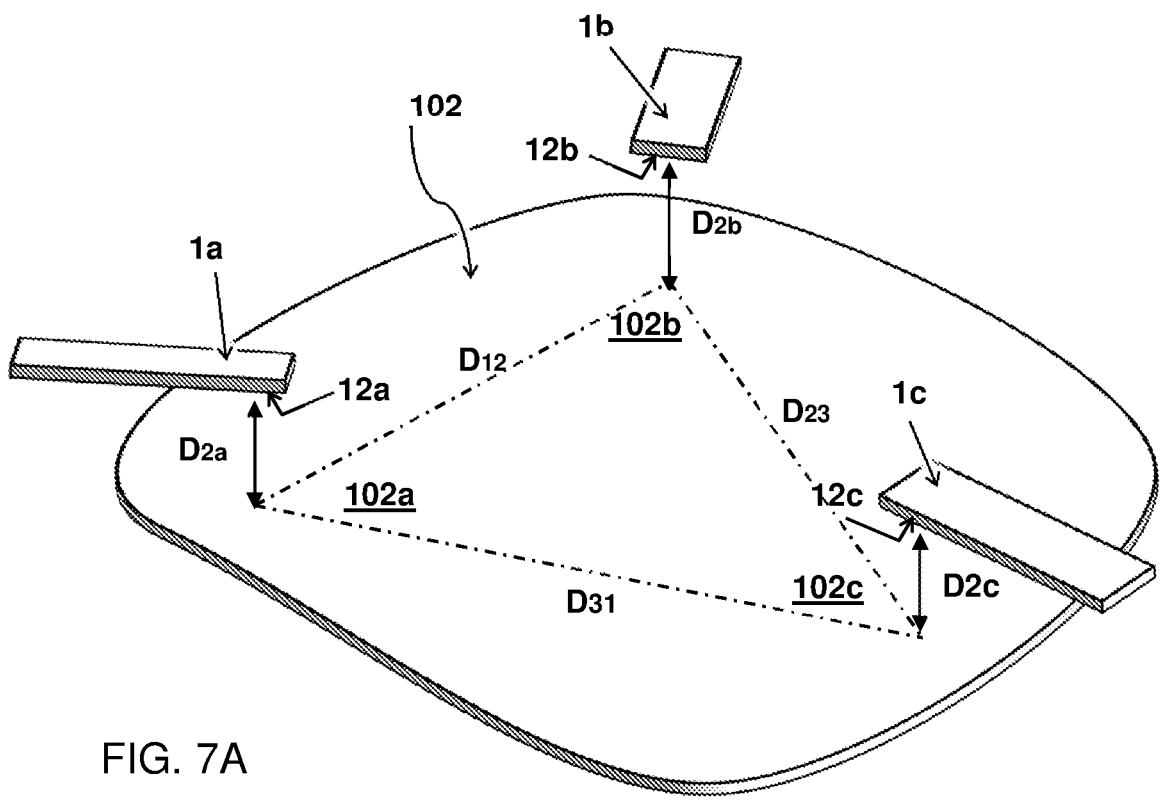
FIGS. 7A and 7B schematically illustrate the positioning of three distance sensors.
Figure 7B:
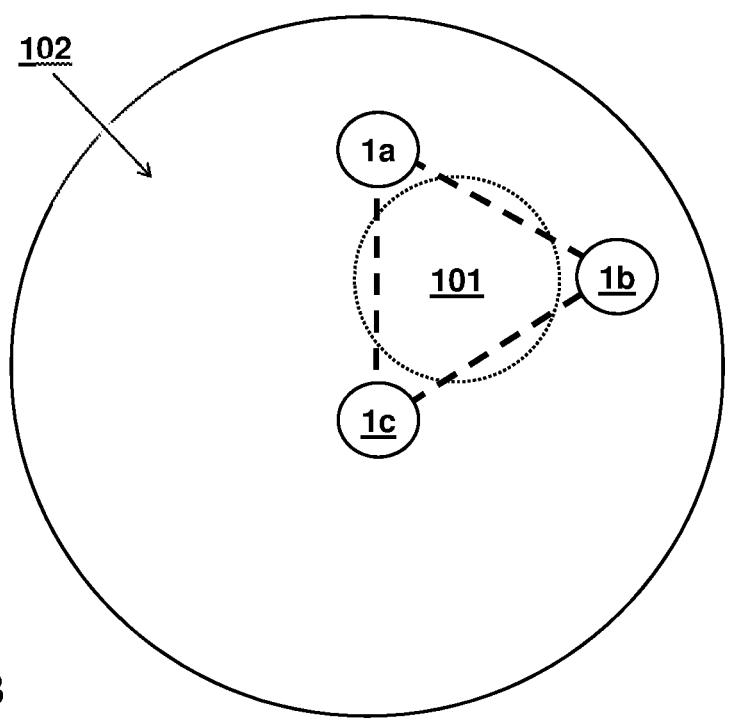

FIGS. 7A and 7B schematically illustrate the positioning of three distance sensors 1a, 1b, 1c. In one embodiment, a distance D12 (and/or D23,D31) between a first MEMS sensor surface 12a and a second MEMS sensor surface 12b is at least two millimetre, at least five millimetre, e.g. between one and five centimetre. In one embodiment, the alignment systems as described herein comprise at least three distance sensors 1a, 1b, 1c. In another or further embodiment, each distance sensor is configured to measure a respective distance D2a, D2b, D2c at different parts 102a,102b,102c of the surface of the second object 102 between their sensor surface 12a, 12b, 12c and the corresponding different parts 102a,102b,102c.

In another or further embodiment, the distance sensors 1a, 1b, 1c are arranged in a triangular configuration, e.g. to measure tilt. In another or further embodiment, the distance sensors 1a, 1b, 1c are arranged around a circumference of the first object 101 as seen transverse to the surface 102a of the second object 102 in FIG. 7B.

In another or further embodiment, the controller (not shown here) is configured to control a tilt of the first object with respect to the surface 102a of the second object 102 based on the measurements of the three distance sensors. For example three non-coupled controllers can be used.

Figure 8A:
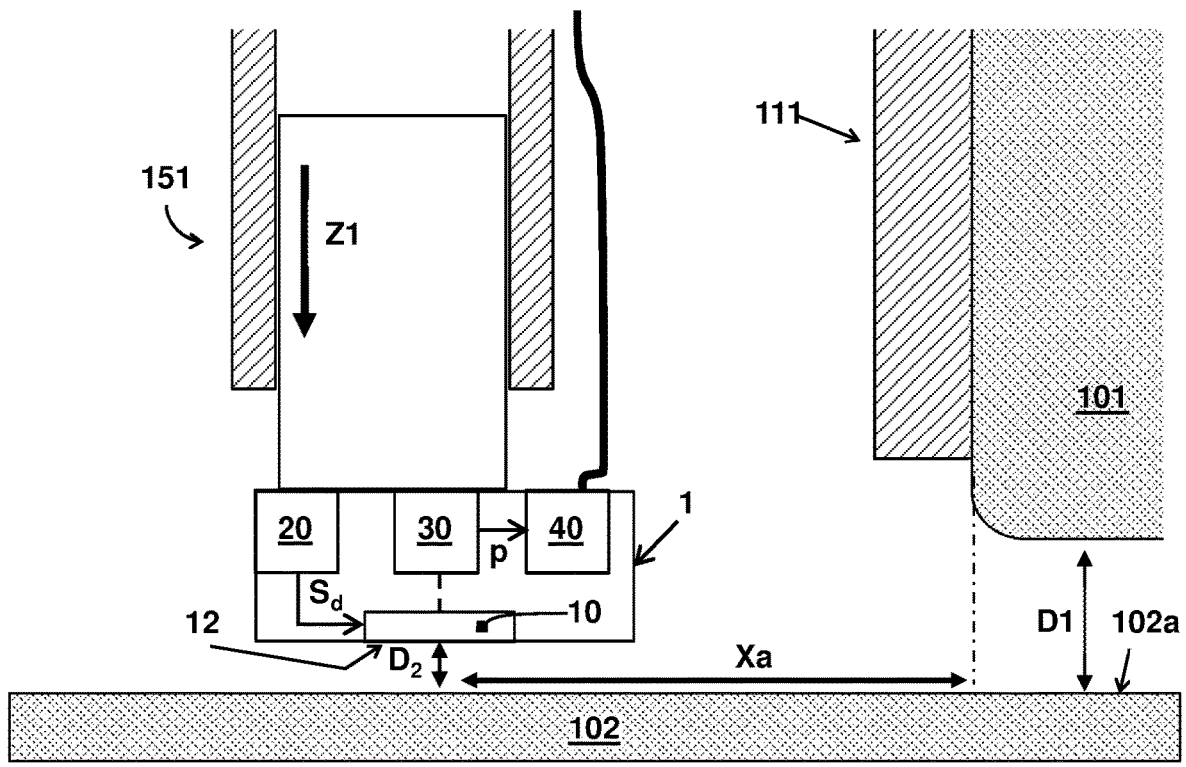
FIG. 8A schematically illustrates example details of a distance sensor adjacent the first object over a surface of the second object.

FIG. 8A schematically illustrates example details of a distance sensor 1 adjacent the first object 101 over a surface 102a of the second object 102.

Figure 8B:
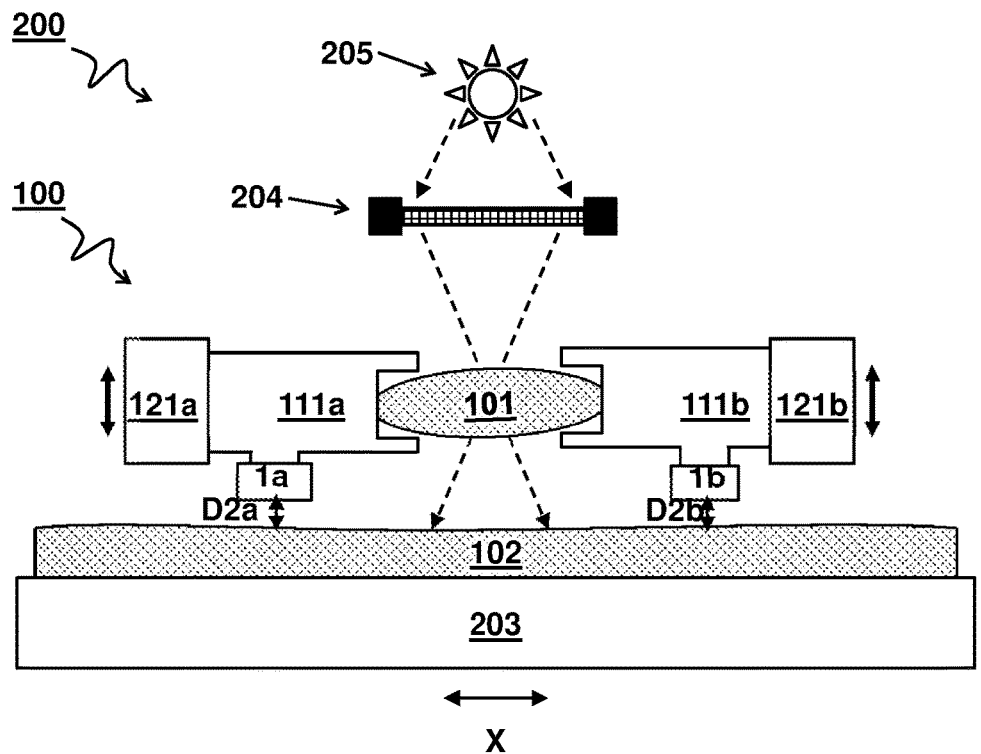
FIG. 8B schematically illustrates use of the alignment system in a lithographic apparatus.

FIG. 8B schematically illustrates use of the alignment system 100 in a lithographic apparatus 200.

In one embodiment, a lithographic apparatus 200 comprises the alignment system 100 as described herein. In one embodiment, the first object 101 is a lens and the object stage 111a, 111b is configured to hold the lens In another or further embodiment, the second object 102 is a wafer.

In one embodiment, the lithographic apparatus 200 comprises an actinic light source 205. In another or further embodiment, the lithographic apparatus 200 comprises a mask stage 204. In another or further embodiment, the lens is part of an imaging system configured to project an image (e.g. of the mask) onto the wafer.

In one embodiment, the lithographic apparatus 200 comprises a wafer stage 203. In another or further embodiment, the alignment system is configured to calibrate the distance between the sensor 1a and the lens 101 based on an image projected through the lens onto the second object 102, e.g. by a contrast measurement of the projected image. In another or further embodiment, the wafer stage 203 is configured to move the wafer 102 along a surface direction X i.e. transverse to the distance D1 between the lens 101 and the wafer 102. In another or further embodiment, the alignment system is configured to keep the first object 101 at the controlled distance D1 from the second object 102 while moving the first object 101 over the surface 102a of the second object 102. For example, the alignment system is configured to keep the lens 101 at a controlled distance from the wafer 102 while moving the lens over the surface of the wafer. For example a distance between the lens and wafer is kept at a value in a range of 1-100 nm. For example the lithographic apparatus 200 may operate in a scanning mode.

The systems and methods as described herein can also be applied in a parallel setting, e.g. multiple systems can be simultaneously active. For example two or more systems can be simultaneously used to keep respective objects at respective distances. For example a first alignment system may keep a first lens at a predetermined distance from a wafer while a second alignment system keeps a second lens at another or the same predetermined distance from the same wafer, e.g. at a different position on the wafer. Using multiple alignment systems in parallel may further increase productivity. The alignment systems in a parallel setting may also cooperate to achieve even further advantage.

Components may optionally be combined or split up into one or more alternative components. The various elements of the embodiments as discussed and shown offer certain advantages, such as prevention of sample or sensor damage, higher precision of the measurement, and enabling extraction of quantitative physical and mechanical properties. Of course, it is to be appreciated that any one of the above embodiments or processes may be combined with one or more other embodiments or processes to provide even further improvements in finding and matching designs and advantages. It is appreciated that this disclosure offers particular advantages e.g. in nanosystems for industrial applications, wherein accurate alignment between components is desired, e.g. semiconductor, metrology, and/or biomedical fields, and in general can be applied for any alignment system.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A distance sensor for estimating a distance to a surface of an object, the distance sensor comprising:
    a micro electric mechanical system (MEMS) comprising:
        a MEMS device having a surface, denoted as a MEMS sensor surface, arranged opposite the surface of said object, and
        a MEMS driver that generates an alternating current (ac) driving signal causing the MEMS sensor surface to vibrate;
    a detector that determines a value of a property of a dynamic behavior of the MEMS; and
    a processing device that provides, based on the value of the property, an estimate of an average distance from a measurement of the dampening of the MEMS sensor surface, as a measured distance between the MEMS sensor surface and the surface of the object.

2. The distance sensor according to claim 1, wherein the property is a frequency with which the MEMS sensor surface vibrates.

3. The distance sensor according to claim 1, wherein the property is an amplitude with which the MEMS sensor surface vibrates.

4. The distance sensor according to claim 1, wherein the property is a quality factor of the MEMS device.

5. The distance sensor according to claim 1, wherein the property is a phase shift between a movement of the MEMS sensor surface and the ac driving signal.

6. The distance sensor according to claim 1, wherein the value of said property is measured with a sensor type taken from the group consisting of: a capacitive sensor, a thermal sensor, an optical sensor, and a piezoresistive sensor.

7. An alignment system for positioning and/or keeping a first object at a controlled distance with respect to a second object, the alignment system comprising:
    a distance sensor for estimating a distance to a surface of an object, the distance sensor comprising:
        a micro electric mechanical system (MEMS) comprising:
            a MEMS device having a surface, denoted as a MEMS sensor surface, arranged opposite the surface of said object, and
            a MEMS driver that generates an alternating current (ac) driving signal causing the MEMS sensor surface to vibrate;
        a detector that determines a value of a property of a dynamic behavior of the MEMS; and
        a processing device that provides, based on the value of the property, an estimate of an average distance from a measurement of the dampening of the MEMS sensor surface, as a measured distance between the MEMS sensor surface and the surface of the object;
    an object stage that holds the first object or the second object, wherein a surface of the first object is at a distance over a surface of the second object;
    an object stage actuator configured to actuate the object stage to vary the distance between the surface of the first object and the surface of the second object; and
    a controller that controls the object stage actuator as a function of the estimated average distance indicated by said distance sensor to position and/or keep the first object at the controlled distance with respect to the second object.

8. The alignment system according to claim 7, wherein the distance sensor is connected to the object stage via a sensor stage, wherein the sensor stage comprises an actuator that variably sets a distance between a surface of the distance sensor and the surface of the first object.

9. The alignment system according to claim 8, wherein the controller is configured to calibrate a distance between the MEMS sensor surface and the surface of the first object.

10. The alignment system according to claim 8, comprising at least two distance sensors that each measure a distance between a respective MEMS sensor surface and different parts of the surface of the second object.

11. The alignment system according to claim 8, wherein the alignment system comprises one or more object stage actuators that each control respective distances between the first object and the different parts of the surface of the second object.

12. The alignment system according to claim 8, comprising an approach stage that positions the first object with respect to the second object, wherein a plurality of object stage actuators are disposed between the object stage and the approach stage.

13. The alignment system according to claim 8, wherein the object stage holds the first object MEMS sensor surface over the surface of the second object.

14. The alignment system according to claim 7, wherein the controller calibrates a distance between the MEMS sensor surface and the surface of the first object.

15. The alignment system according to claim 7, comprising at least two distance sensors that each measure a distance between a respective MEMS sensor surface and different parts of the surface of the second object.

16. The alignment system according to claim 7, wherein the alignment system comprises one or more object stage actuators that each control respective distances between the first object and the different parts of the surface of the second object.

17. The alignment system according to claim 7, comprising an approach stage that positions the first object with respect to the second object, wherein a plurality of object stage actuators are disposed between the object stage and the approach stage.

18. The alignment system according to claim 7, wherein the object stage holds the first object MEMS sensor surface over the surface of the second object.

19. The alignment system according to claim 7, wherein the distance between the first object and the second object is less than a hundred nanometres.

20. The alignment system according to claim 7, wherein the distance between the first object and the second object is less than a hundred nanometres.

21. A method of aligning a first object at a controlled distance with respect to a second object, the method comprising:
    providing an object stage that holds the first object or the second object, wherein a surface of the first object is at a distance over a surface of the second object;
    providing an object stage actuator that actuates the object stage to vary a distance between the surfaces of the first and second objects;
    providing a distance sensor that measures a distance to a surface of the second object, the distance sensor including a micro electric mechanical system (MEMS) comprising:
        a MEMS device having a surface, further denoted as a MEMS sensor surface, arranged opposite the surface of said second object, and
        a MEMS driver that generates an alternating current (ac) driving signal causing the MEMS sensor surface to vibrate;
    providing a detector that determines a value of a property of a dynamic behavior of the MEMS;
    providing a processing device that provides, based on the value of the property, an estimate of an average distance from a measurement of the dampening of the MEMS sensor surface, as a measured distance between the MEMS sensor surface and the surface of the second object; and
    controlling the object stage actuator as a function of the measured distance to keep the first object at the controlled distance with respect to the second object.

* * * * *